United States Patent [19]

Takahashi et al.

[11] Patent Number: 5,052,472
[45] Date of Patent: Oct. 1, 1991

[54] LSI TEMPERATURE CONTROL SYSTEM

[75] Inventors: Kenji Takahashi, Abiko; Takuji Torii, Ushiku; Takao Senshu; Tetsuji Yamashita, both of Shizuoka; Shizuo Zushi, Hadano, all of Japan

[73] Assignee: Hitachi, Ltd., Tokyo, Japan

[21] Appl. No.: 382,203

[22] Filed: Jul. 19, 1989

[51] Int. Cl.⁵ ............... F25B 29/00; F25B 49/00; H01L 23/46; F28D 15/00
[52] U.S. Cl. ............... 165/1; 165/30; 165/39; 165/40; 165/80.4; 165/101; 165/104.33; 62/185; 62/201; 62/228.4; 361/385
[58] Field of Search ............... 62/201, 228.4, 185; 165/80.4, 34, 101, 1, 39, 40, 30, 104.33; 361/385, 382, 381

[56] References Cited

U.S. PATENT DOCUMENTS

| | | | |
|---|---|---|---|
| 2,917,685 | 12/1959 | Wiegard | 361/385 |
| 3,214,153 | 10/1965 | Hauff et al. | 165/80.4 |
| 4,037,045 | 7/1977 | Beriger et al. | 361/385 |
| 4,109,707 | 8/1978 | Wilson et al. | 165/80.4 |
| 4,177,649 | 12/1979 | Venema | 62/228.4 |
| 4,512,161 | 4/1985 | Logan et al. | 361/385 |
| 4,621,678 | 11/1986 | Hahn et al. | 165/34 |
| 4,656,836 | 4/1987 | Gilbertson | 62/185 |
| 4,729,424 | 3/1988 | Mizuno et al. | 62/175 |
| 4,865,123 | 9/1989 | Kawashima et al. | 165/101 |
| 4,873,838 | 10/1989 | Voorhis et al. | 62/228.4 |

FOREIGN PATENT DOCUMENTS 56-24622  3/1981  Japan .
56-157745 12/1981  Japan .

OTHER PUBLICATIONS

Nikkei Electronics, Water Cooled System of Closed Loop Type, Jun. 17, 1985, pp. 243–266.

*Primary Examiner*—John K. Ford
*Attorney, Agent, or Firm*—Antonelli, Terry, Stout & Kraus

[57] ABSTRACT

An LSI temperature controlling system has closed LSI cooling water circuit, and a refrigeration circuit including a motor-driven refrigerant compressor, a first heat exchanger for exchanging the heat of the LSI cooling water and the refrigerant and a second heat exchanger for exchanging the heats of the refrigerant and another fluid. The motor speed is controlled by an inverter the operation of which is controlled based on the temperature of the LSI cooling water measured by a temperature detector. A heater is used to suppress dew formation on LSI substrates.

10 Claims, 16 Drawing Sheets

F I G. 12
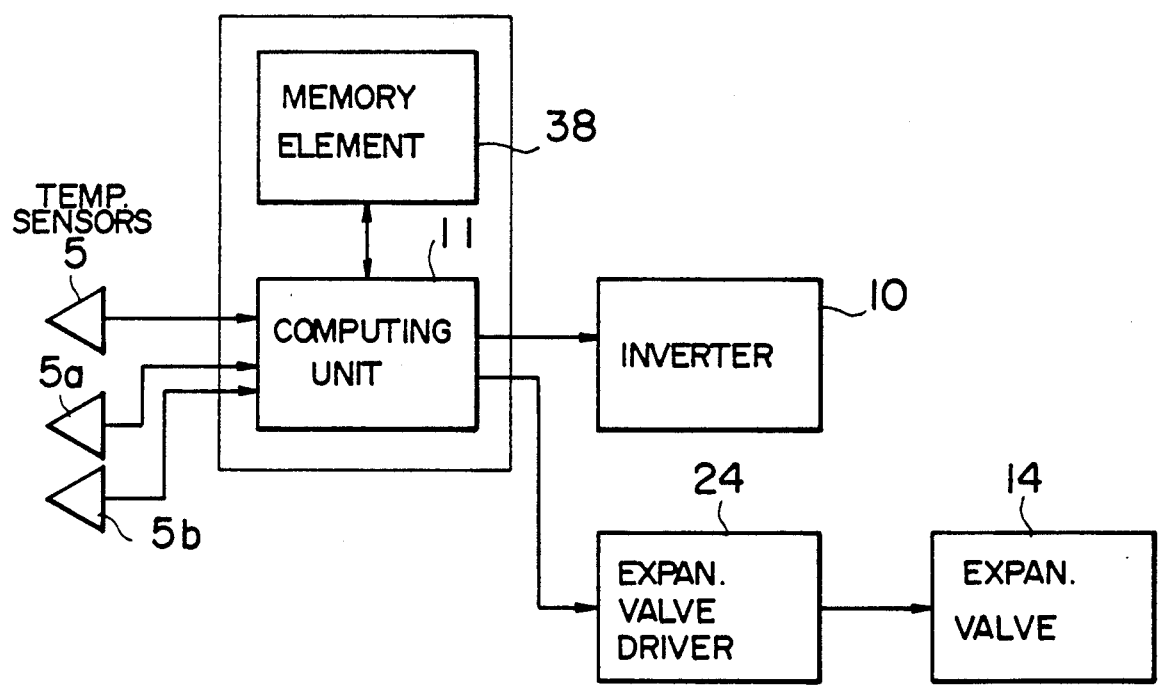

LSI TEMPERATURE CONTROL SYSTEM

BACKGROUND OF THE INVENTION

The present invention relates to a cooling water supply system for cooling a semiconductor integrated circuit. More particularly, the present invention is concerned with a temperature control system which is suitable for use in cooling a large-scale computer and effective in suppressing dewing on cooling pipes and LSI substrates.

In general, a large-scale computer incorporates a number of LSIs each of which generate heat. To cool these LSIs, it has been a common measure to circulate cooling water in contact with the reverse sides of the LSI substrates so as to directly cool the LSIs. The cooling water which has been heated as a result of cooling of the LSIs is cooled by a refrigeration cooling system which is composed of a compressor, a condenser, an evaporator and an expansion valve through which a refrigerant such as freon is circulated while making phase changes. Such a known cooling system is exemplarily shown in FIG. 18. The cooling water for cooling LSIs is circulated through a cooling line 3 by a pump 4 and is cooled by a first heat exchanger 7 which is the evaporator of a refrigeration cooling system. The refrigeration cooling system has a compressor 8, a second heat exchanger (condenser) 12, an expansion valve 14 and the above-mentioned first heat exchanger (evaporator) 7 which are connected in a closed loop of a refrigerant line 6 through which a refrigerant such as freon flows. The refrigerant frees heat in the condenser 12 through which an external cooling water is supplied to carry the heat away from the condenser.

In the above-described temperature control system, it is often experienced that the temperature of water for cooling LSIs is undesirably deviated from a predetermined command temperature due to various reasons such as (1) mismatching between the rate of generation of heat from the LSIs and the cooling power of the refrigeration cooling system which is determined by the power of the motor for driving the compressor of the refrigeration cooling system, and (2) a fluctuation of the temperature of the cooling water circulated through the condenser. More specifically, compressor motors of refrigeration cooling system now available are standardized and have respective rated capacities. Such motors are used in, for example, in Japan in which commercial electrical power is supplied at 50 Hz or 60 Hz, so that the cooling capacities of the refrigeration cooling systems are substantially fixed. It is not easy to obtain a matching between the cooling capacity which is fixed and the varying cooling load, i.e., the heat generation from LSIs. Referring now to the fluctuation of the cooling water temperature, the heat carried by the cooling water is radiated to the ambient air from a cooling tower through which the cooling water is circulated. The rate of heat radiation to the ambient air, however, varies depending on the temperature of the ambient air. This causes a change in the temperature of the cooling water circulated through the condenser of the refrigeration cooling system resulting in the cooling power being changed.

Control of the temperature of the cooling water for cooling LSIs is a critical requirement because a too high cooling water temperature allows LSIs to be overheated resulting in malfunctioning of the electronic circuit incorporating the LSIs, while a too low cooling water temperature undesirably allows dewing on the cooling water pipes or on the LSI substrates particularly when the humidity of the ambient air is high, causing an impediment in the safe functioning of the electronic circuit. From the view point of stable and reliable operation of LSIs, therefore, it is highly desirable that the cooling water temperature is maintained within a small range of temperature offset from a command temperature.

One of the methods commonly used for controlling the cooling water temperature in conformity with the command cooling water temperature is to repeatedly start and stop the compressor of the refrigeration cooling system. More specifically, when the temperature of the cooling water decreases below the command temperature for a reason such as that described before, the compressor of the refrigeration cooling system is stopped to allow the temperature of the cooling water or the LSIs to rise and approach the command temperature. When the cooling water temperature exceeds the command temperature during suspension of the compressor, the compressor is started again to cool the cooling water to lower the cooling water temperature to the level of the command temperature. When this cooling water temperature control method is used, the repeated start and stop of the compressor tend to cause an abrupt temperature change of the LSIs and, in addition, the amount of offset of the cooling water temperature undesirably from the command temperature increases. In order to overcome such problems, it is necessary that the quantity of the cooling water in the water cooling system be increased so as to minimize the influence of the repeated start and stop of the compressor. It will be understood that the greater quantity of cooling water provides a greater heat capacity so that the rate of change in the cooling water due to start a starting and stopping of the compressor is reduced to suppress the change in the temperature of the cooling water. To realize such a measure, one of the conventional system employs a water reservoir or tank 20 in the closed loop of the cooling water system shown in FIG. 18. The cooling system operates with the water tank 20 substantially filled with cooling water so that the quantity of water possessed by the cooling water system is increased so as to avoid any abrupt change in the LSI cooling water temperature attributable to the change in the cooling power caused by repeated start and stop of the compressor.

The other problem, i.e., dewing on the LSI substrates, is liable to occur also when a large-scale computer is started.

For instance, it is assumed here that operation of a large-scale computer with number of LSIs has been suspended long, with an air heating system of the computer room also having been kept inoperative. If the air heating system of the computer room is started simultaneously with the start of the computer, the temperature of the ambient air in the computer room rises while the cooling water temperature is still low due to the large heat capacity of the water. Consequently, the temperature of the cooling water pipes and the LSI substrates may decrease to a temperature below the dewing point which is determined by the temperature and humidity of the air in the room. In such a case, the water content of the air is condensed to form dews on the cooling water pipes and the LSI substrates. In order to obviate this problem, it is necessary to rise the temperature of the LSI cooling water to a comparatively high level before the air temperature is raised by air heating system, when a large-scale computer is started after a long suspension of operation, i.e., from a state in which the cooling water has been lowered to the same level as the air temperature before the start of the air heating system.

According to one of the conventional methods for raising the cooling water temperature after a long suspension of operation of a large-scale computer, the kinetic energy of vanes of water circulating pump in the cooling water system is connected into thermal energy which is applied to the water so as to heat the cooling water.

This type of technology is disclosed, for example, in an article "PACKAGING OF SUPER-COMPUTER SX SERIES FOR COOLING MULTI-CHIP PACKAGE" in the Nikkei Electronics, June 17, 1985, pp 243-266.

As described before, the most common method for controlling the cooling water temperature is to repeatedly start and stop the compressor of the refrigeration cooling system, and this method requires a large water tank so as to increase the quantity of the cooling water in the water cooling system in order to control the cooling water temperature in conformity with the command temperature. Such a water tank, however, requires a large installation space and, in addition, additional piping arrangement is necessary for connecting this tank, so that the size of the cooling system is undesirably increased. When the apparatus to be cooled by the system of the present invention is a large-scale computer which is in most cases installed in a computer room, a problem encountered is that the size of the casing of the cooling system including such a large water tank occupies a considerably large area in the limited space of the computer room, which is quite contrary to the demand for reduction in the installation area of the computer system.

SUMMARY OF THE INVENTION

Accordingly, an object of the present invention is to provide a system for and a method of controlling the temperature of LSIs which are capable of effecting an exact control of the LSI cooling water temperature and which eliminate any necessity for a large water tank to enable a reduction in the size of the cooling apparatus.

The LSI temperature controlling system of the present invention comprises a closed fluid circuit through which a first fluid for controlling the temperature of an LSI is circulated; and a refrigeration circuit through which refrigerant is circulated. The refrigeration circuit includes a refrigerant compressor, and a first heat exchanger for exchanging the heats of the first fluid and the refrigerant. The system further includes means for expanding the refrigerant compressed by the compressor and a second heat exchanger for exchanging the heats of the refrigerant and a second fluid; an electric motor for driving the refrigerant compressor; an inverter for controlling the speed of the motor; a temperature sensor for detecting the temperature of the first fluid to generate a temperature signal; and an electric control circuit responsive to the temperature signal to control the operation of the inverter. The method of operating an LSI temperature controlling system according to the invention comprises the steps of: detecting the temperature of the LSI cooling water; and controlling the frequency of the inverter based on a difference between the thus detected temperature of the LSI cooling water and a preset reference temperature.

Collection of external heat and transfer of the same to the LSI cooling water enables an efficient rise of the cooling water temperature, which shortens the time required for the LSI cooling water to be heated to a command temperature thus shortening the start-up time of LSIs. According to the present invention, a quick rise of the LSI cooling water temperature is possible by virtue of the heat pump cycle. Namely, heat is picked up by the refrigerant such as freon from a low-temperature heat sources such as the outdoor air or air in the room in which a computer having the LSIs is installed, and the refrigerant is compressed to generate heat which is transferred to the LSI cooling water thereby promoting the heating up of the LSI cooling water to the command temperature. It is also possible to cool the LSI cooling water by reversing the heat pump cycle so as to realize a refrigeration cycle, so that the heat generated by the LSIs is transferred to the LSI cooling water and then to the refrigerant of low temperature, whereby the LSIs are effectively cooled. The switching between the heat pump cycle and the refrigeration cycle can be done in a short time simply by switching the position of the four-way valve.

When the refrigerant circuit operates in the refrigeration mode for cooling the cooling water, the first heat exchanger serves as an evaporator so that the refrigerant of a reduced pressure is boiled by the heat transferred from the cooling water, whereby the temperature of the cooling water is lowered. The refrigerant in the gaseous phase thus obtained is compressed by the compressor which discharges, through a discharge pipe, the compressed gaseous refrigerant to the second heat exchanger which now functions as a condenser. The compressed gaseous refrigerant is then liquefied in the condenser as a result of delivery of the heat to an external fluid, e.g., a cooling water circulated through the second exchanger or the air in the computer room. The liquefied refrigerant returns to the first heat exchanger through an expansion valve which serves as the pressure reducer.

For enabling the refrigerant circuit to operate as a heat pump, the four-way valve is operated so as to effect a switching of connection to the suction and discharge pipes of the compressor. Namely, the four way valve is operated such that the second heat exchanger which has been connected to the discharge side of the compressor is connected to the suction side of the compressor, whereas the first heat exchanger which has been connected to the suction side of the compressor is brought into connection to the discharge side of the compressor. Thus, the connection between the compressor and the heat exchangers is switched depending on whether the refrigerant circuit is used in the refrigeration mode or in the heat pump mode. It is therefore possible to effect both cooling and heating of the LSI cooling water through the second heat exchanger.

Another method of heating the LSI cooling water when a large-scale LSI is started is to use a heater which can deliver heat to the LSI cooling water.

The heater is disposed in the passage of the cooling water which is circulated through the heat exchanger which is arranged between the LSI cooling passage and the refrigerant passage. The rate of generation of heat by the heater is controlled through a control of the electrical power supplied to the heater. This heater is used to heat up the LSI cooling water in advance of the start-up of the LSIs. The temperature of the LSI cooling water is sensed by a temperature sensor disposed in the cooling water passage and is fed back to a controller which operates to reduce the electrical power supplied to the heater as the LSI cooling water temperature approaches the command temperature, so that the LSI cooling water can be heated to the command temperature in a short time. A more delicate control of the LSI cooling water temperature is possible by operating, together with the heater, the compressor which is controlled by the inverter.

When the refrigerant circuit is used in the refrigeration mode, the refrigerant is boiled and evaporated in the evaporator by the heat derived from the LSI cooling water which is circulated in a heat-exchanging relation with the refrigerant. The gaseous phase of the refrigerant thus obtained is suctioned and compressed by the compressor and is discharged through a compressor discharge pipe into the second heat exchanger (condenser) where the heat possessed by the compressed hot refrigerant gas is delivered to the external fluid, e.g., external cooling water supplied to the heat exchanger, whereby the second refrigerant is liquefied. The liquid phase refrigerant is then made to pass through the expansion valve to reduce its pressure and is introduced into the evaporator where it exchanges heat with the LSI cooling water thereby cooling the latter. It is therefore possible to finely and linearly control the discharge rate of the compressor and, hence, the rate of cooling of the LSI cooling water, by finely and linearly controlling the speed of the compressor driving motor by means of the inverter.

The frequency of the current output from the inverter is determined in accordance with the temperature sensor disposed in the passage of the LSI cooling water. Namely, the inverter frequency is finely controlled in accordance with the difference between the LSI cooling water temperature detected by the temperature sensor and a predetermined command temperature. Consequently, the speed of the compressor, which is the rotational speed in the case of a rotary compressor and the number of reciprocating cycles of piston in case of reciprocating compressor, is finely controlled to enable a delicate control of the rate of circulation of the refrigerant gas and, therefore, the rate of cooling of the LSI cooling water by the refrigerant, whereby the LSI cooling temperature is finely controlled in conformity with the command temperature.

According to the present invention, it is thus possible to finely control the rate at which the LSI cooling water is cooled by the refrigerant, by controlling the operation of the inverter in response to a change in the temperature of the LSI cooling water. It is therefore possible to cool the LSIs precisely to the desired temperature, without requiring any water tank which has been necessary for the purpose of increasing the quantity of the water in the known system relying upon on-off control of the compressor. In addition, the control of the LSI cooling water temperature can be executed without causing hunting.

When the temperature of the LSI cooling water is still low when the LSIs are started, the refrigerant gas heated through the heat pump cycle delivers heat to the LSI cooling water until the LSI cooling water is heated up to the predetermined command temperature. It is thus possible to raise the LSI cooling water temperature to the command temperature in a short time.

When the command temperature of the LSI cooling water is reached, the four-way valve is operated to switch the operation mode of the refrigerant circuit from the heat pump mode to the refrigeration cycle mode, to thereby cool the LSI cooling water and, accordingly, the LSIs.

Thus, the LSI temperature control system of the present invention has both the cooling function for cooling the LSI cooling water and the function for heating the same, the switching between these two modes being easily effected by, for example, a four-way valve which switches the direction of flow of the refrigerant, thus enabling a quick control of the LSI cooling water temperature.

The cooling and heating of the LSI cooling water can be accomplished finely and linearly by controlling the discharge rate of the compressor by the inverter which drives the compressor at a speed determined in accordance with the water temperature detected by the temperature sensor.

In another method of the present invention, the LSI cooling water temperature is raised directly by a heater so as to enable a quick rise of the LSI cooling water temperature to the command temperature before the LSIs are started. When the LSI cooling water temperature has approached the command temperature, the heat generating rate of the heater is decreased or the heater is stopped to prevent any overshoot of the temperature attributable to thermal inertia caused by the heat capacity of the LSI cooling water. Then, the cooling system employing the inverter-controlled compressor is started to maintain the LSI cooling water temperature at the command level. Once the LSIs are started, the temperature of the LSI cooling water is controlled by the refrigeration cycle employing the inverter-controlled compressor.

BRIEF DESCRIPTION OF THE DRAWINGS

FIG. 12 is a block diagram of the component parts of the system operative to carry out the control shown in FIG. 11;

DESCRIPTION OF THE PREFERRED EMBODIMENTS

Figure 1:
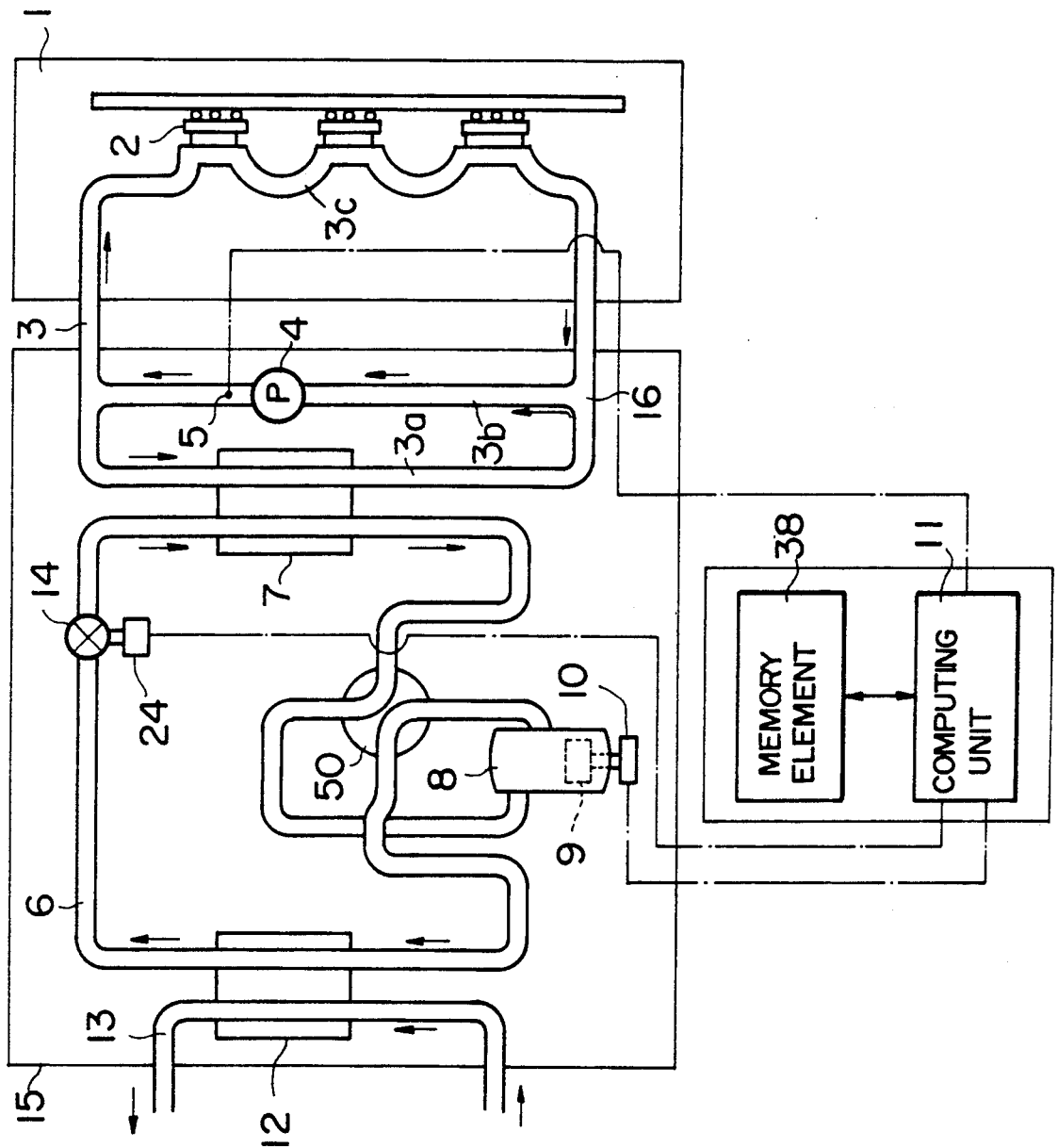
FIG. 1 is a diagrammatic illustration of an embodiment of an LSI temperature controlling system according to the present invention.

FIG. 1 shows an embodiment of the LSI temperature control system of the present invention. The LSI temperature control system has a cooling water circuit 3 for cooling a number of LSIs 2 mounted in an LSI casing 1. The water circuit 3 includes a first passage 3a, a second passage 3b connected fluidly in series with the first passage 3a and a third passage 3c connected fluidly in series to the second passage 3b and extending fluidly in parallel to the first passage 3a. LSI cooling water is circulated through these passages 3a, 3b, 3c by a cooling water pump 4 disposed in the second passage 3b. The third passage 3c has portions disposed adjacent to the LSI's 2. More specifically, the water pump is operative to pump the LSI cooling water so that the water pumped by the pump 4 flows first through the second passage 3b downstream of the pump 4 and is then divided into a first part which flows to the first passage 3a and a second part which flows through the third passage 3c in a heat exchanging relationship to the LSI's 2 in a manner to be described more fully hereinbelow. The first and second parts of the water are then returned to the second passage 3b upstream of the water pump 4 and collected together therein, with the thus collected water again being repumped by the water pump 4. The temperature of the LSI cooling water is detected by a temperature sensor 5 disposed in the second passage 3b downstream of the water pump 4. A first heat exchanger 7 is capable of performing a heat exchange between the LSI cooling water flowing through the first passage 3a of the water circuit 3 and a refrigerant which flows through a refrigerant passage 6. The system also includes a motor 9 for compressing the refrigerant by being driven by a compressor 8 the operation of which is controlled by an inverter 10. The temperature controlling system further includes a computing unit 11 for performing a computation on the basis of the temperature detected by the temperature sensor 5 and includes also a memory element 38. The LSI temperature control system of the present invention further has a second heat exchanger 12 for a heat exchange between the refrigerant and a refrigerant cooling water, a refrigerant cooling water passage 13, an expansion valve 14, and a four-way valve 50 for switching the direction of flow of the refrigerant. The components of the LSI temperature control system are housed in a casing 15. The LSI temperature control system thus constructed is installed in an air-conditioned computer room. Arrows appearing in FIG. 1 indicate the direction of flow of the fluids, i.e., the refrigerant and the cooling water. As apparent, the first and second parts of water pumped by the water pump 4 respectively carry the heat from the refrigerant flowing through the heat exchanger 7 and the heat from the LSI's 2. Accordingly, the two parts of water flow cooperate to exchange the heat from the refrigerant and LSI's.

Thus, when the four-way valve 50 is set in the position shown in FIG. 1, the refrigerant flows in the direction of the arrows. In the state shown in FIG. 1, the first heat exchanger 7 serves as an evaporator in which the refrigerant is evaporated by the heat from the LSI cooling water, thereby cooling the LSI cooling water and, hence, LSIs. The gaseous phase of the refrigerant obtained in the evaporator is then compressed to become a gaseous refrigerant of high pressure and temperature and is introduced into the second heat exchanger 12 which functions as the condenser, thus discharging heat to the cooling water flowing through the passage 13 for the cooling water which cools the refrigerant. Although water is circulated as the cooling medium through the second heat exchanger in the system shown in FIG. 1, this is not exclusive and the arrangement my be such that air is used as the cooling medium for cooling the refrigerant in the second heat exchanger 12.

Figure 2:
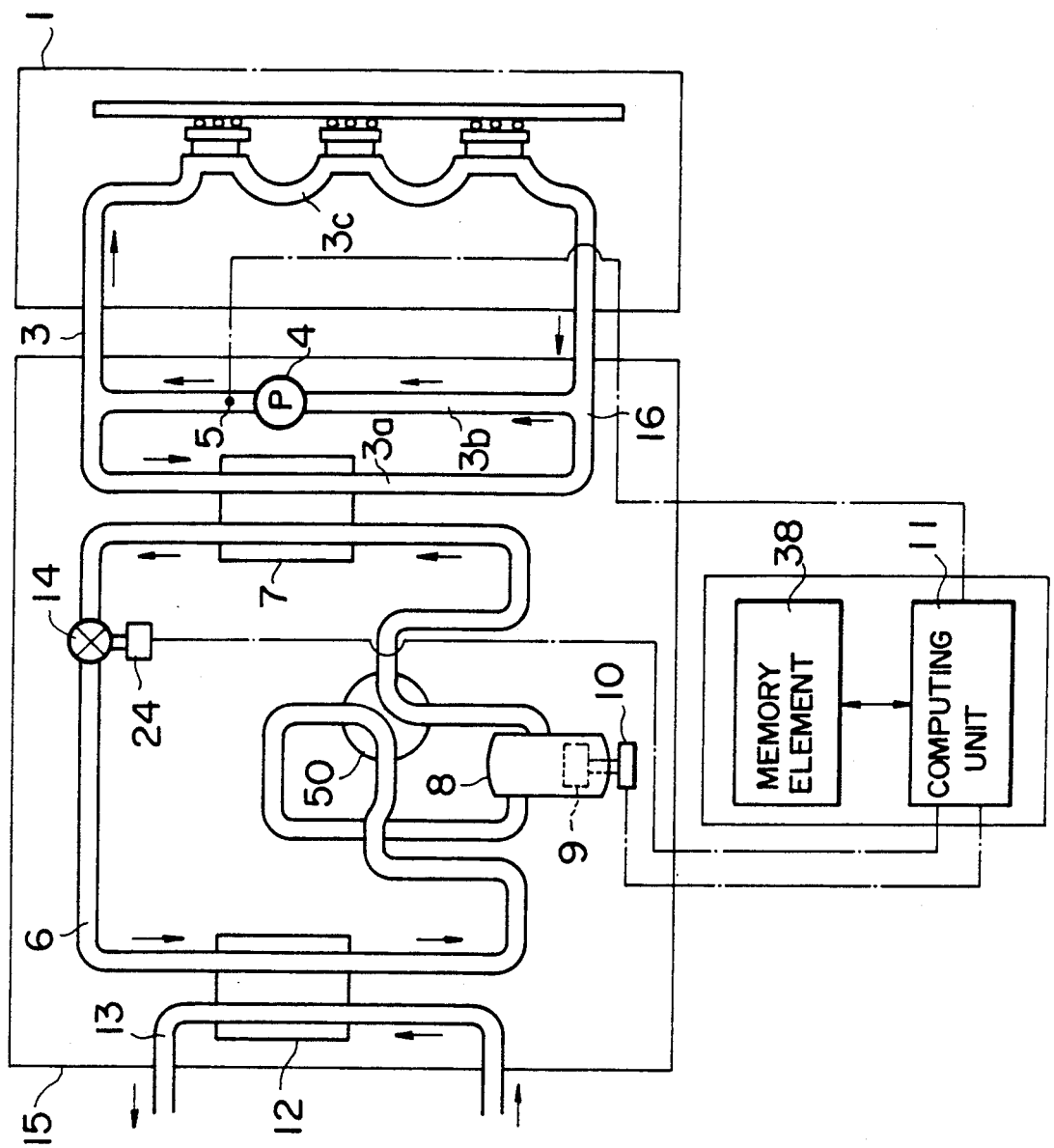
FIG. 2 illustrates the LSI temperature controlling system in a different operative position.

In FIG. 2, the four-way valve 50 has been rotated through 90° from the position of FIG. 1 so as to realize a heat pump cycle. This cycle is used when the LSIs are started.

In this case, the inverter 10 is operated in accordance with the temperature of the cooling water sensed by the temperature sensor in the cooling water circuit 3 so as to change the frequency of the driving current thereby controlling the speed of operation of the compressor 8. Consequently, the rate of circulation of the refrigerant and, therefore, the rate of heating of the cooling water in the first heat exchanger 7, is controlled so as to enable the LSI cooling water to be quickly heated up to an aimed temperature. More specifically, the inverter 10 sets the driving current frequency high in a period immediately after the start-up of the LSIs so as to increase the rate of heating of the LSI cooling water because in such a period the difference between the actual LSI cooling water temperature and the command temperature is still large. Then, the inverter 10 progressively decreases the frequency of the driving current as the actual LSI cooling water temperature approaches the command temperature. In this manner, an efficient control of the LSI cooling water temperature is conducted to enable quick rise of the LSI cooling water temperature to the command temperature.

It is thus possible to selectively cool and heat the cooling water for cooling LSIs simply by changing the direction of flow of the refrigerant in the refrigerant passage 6.

During the operation of the LSIs 2, the command temperature of the LSI cooling water is so set as to be higher than the dewing point which is determined by the temperature and humidity of the air in the computer room, thereby preventing dewing on the cooling water pipes and/or the LSI substrates, and the temperature of the LSI cooling water is controlled in conformity with this command temperature. It is assumed here that, when the air temperature in the computer room is 20° C., the command temperature of the cooling water is determined to be 25° C. with a certain safety factor. It is also assumed that the computer incorporating the LSIs is turned off in winter so that the air temperature in the computer room and the temperature of the LSI cooling water have been lowered to a temperature which depends on the ambient air temperature, e.g., down to 10° C. When the computer is started again, if the air in the computer room is quickly heated up to 20° C., the rise of the temperature of the LSI cooling water still remains low through the water may be heated to a temperature above 10° C. Thus, the temperature of the surfaces of the cooling water pipes and the LSI substrates are still below the dewing point which is determined by the humidity of the air and the temperature of the air which is 20° C. in this case. It is therefore necessary to raise the temperature of the LSI cooling water before the start of the heating of the air.

Figure 3:
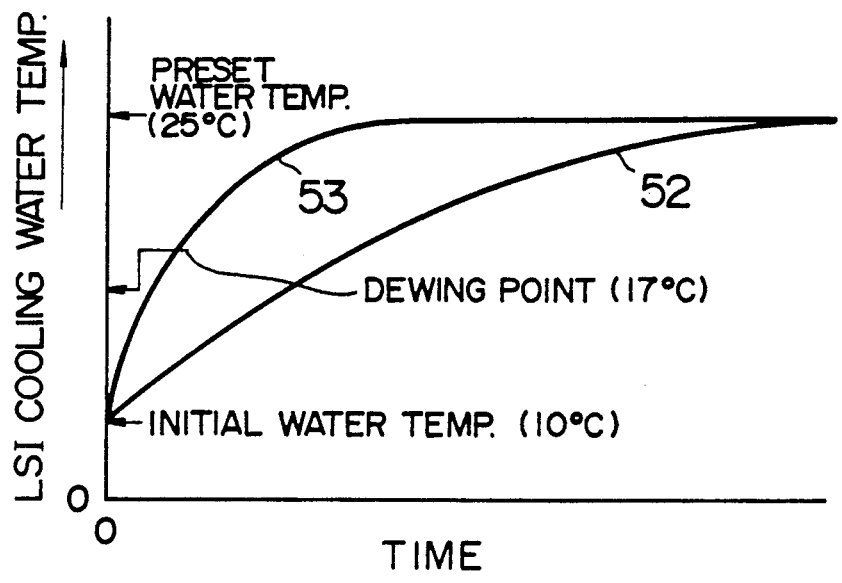
FIG. 3 graphically illustrates the relationship between the temperature of LSI cooling water and the time measured from the start of circulation of the LSI cooling water.

FIG. 3 is a graph showing the manner in which the whole of the cooling water is heated to the above-mentioned command temperature. More specifically, in FIG. 3, the axis of ordinate shows the LSI cooling water temperature, while the axis of abscissa represents the time.

The temperature of the LSI cooling water is same as the room air temperature, i.e., 10° C., at the beginning of the control. In FIG. 3, a curve 52 shows the manner in which the LSI cooling water temperature rises when the water is heated by a conventional method which relies upon the transfer of energy from the vanes of the water circulating pump of the refrigeration system without operating the compressor. It will be seen that the rate of rise of the temperature is very small in this case so that an impractically long time is required for the LSI cooling water temperature to rise to the command temperature beyond the dewing point which is, for example, 17° C.

A curve 53 shows the manner in which the LSI cooling water temperature rises when the heating is conducted by the method of the present invention, i.e., by delivering the heat from the compressed refrigerant to the LSI cooling water by operating the refrigeration cycle in the heat-pump mode, while controlling the discharge rate of the compressor 8 by means of the inverter 10. It will be seen that the LSI cooling water temperature is raised to the command temperature in a short period of time.

As has been described, according to the present invention, the temperature of the LSI cooling water can be raised to the level which enables the LSIs to operate without any risk of dewing, by transferring the heat from the refrigerant compressed by the compressor to the LSI cooling water. Once the command temperature of the LSI cooling water is reached, the refrigerant circuit is switched to the refrigeration mode by reversing the direction of flow of the refrigerant, so that the heat collected from the LSIs is discharged through the heat exchanger 7.

Figure 4:
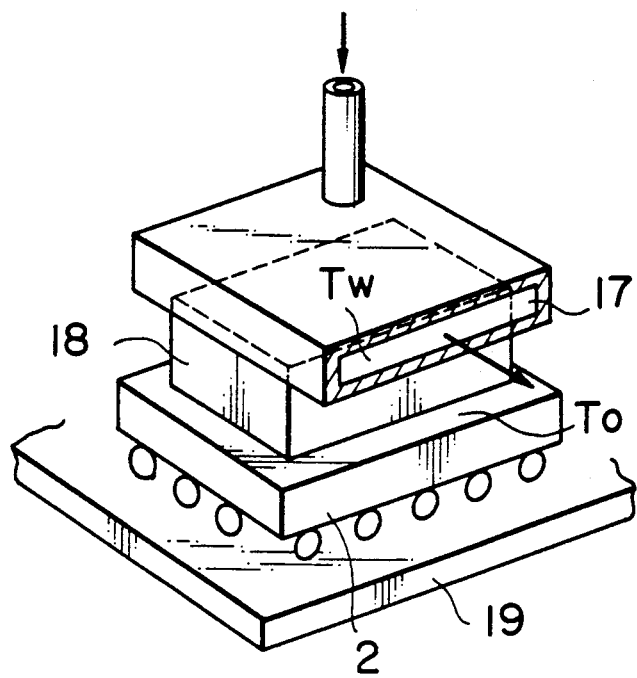
FIG. 4 is an enlarged perspective view of an LSI disposed in heat exchange relationship with a flow of the LSI cooling water.
Figure 5:
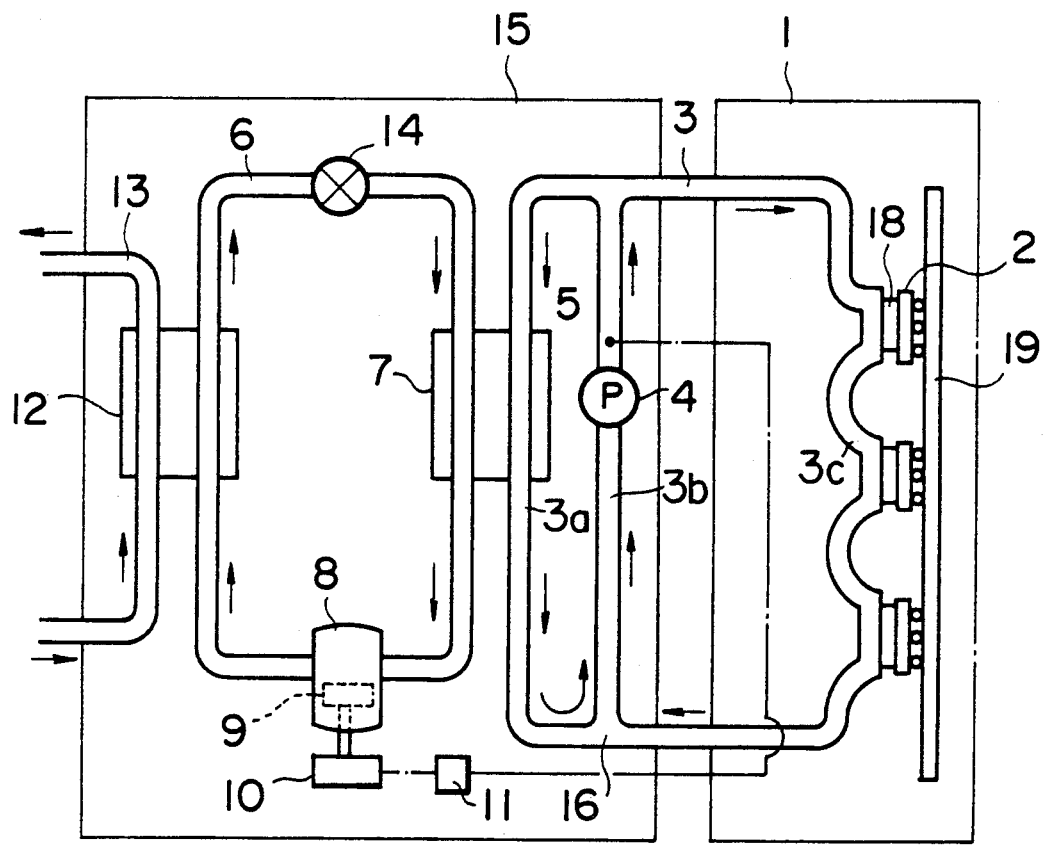
FIG. 5 is similar to FIG. 1 but illustrates another embodiment of the present invention.

FIG. 4 schematically shows the construction of the LSI cooling section. An LSI 2 carried by a substrate 19 is connected through a heat conductor 18 to the wall of a conduit 17 which forms a part of the cooling water passage 36 through which the LSI cooling water is circulated. Consequently, the heat generated from the LSI 2 is transferred to the cooling water in the conduit 17 through the heat conductor 18. In FIG. 4, symbols Tw and To respectively represent the temperature of the LSI cooling water and the temperature of the surface of the LSI package. The LSI cooling water is then circulated through the cooling water passage 3a past the first heat exchanger (evaporator) 7 so as to transfer heat to the refrigerant thereby being cooled. The embodiment of FIG. 5 is devoid of the four-way valve used in the first embodiment, so that it performs only cooling of the LSI cooling water. Thus, unlike the first embodiment the refrigerant circuit of this embodiment cannot operate in the heat-pump mode. The expansion valve used in the embodiment shown in FIG. 1 is substituted by an expansion valve of a fixed opening degree. The memory element, which is connected to the computing unit in the embodiment of FIG. 1, is omitted from this embodiment.

In the embodiment of FIG. 5, the first heat exchanger 7 is used only as an evaporator in which heat is exchanged between the refrigerant and the LSI cooling water so that the LSI cooling water is cooled.

Figure 6:
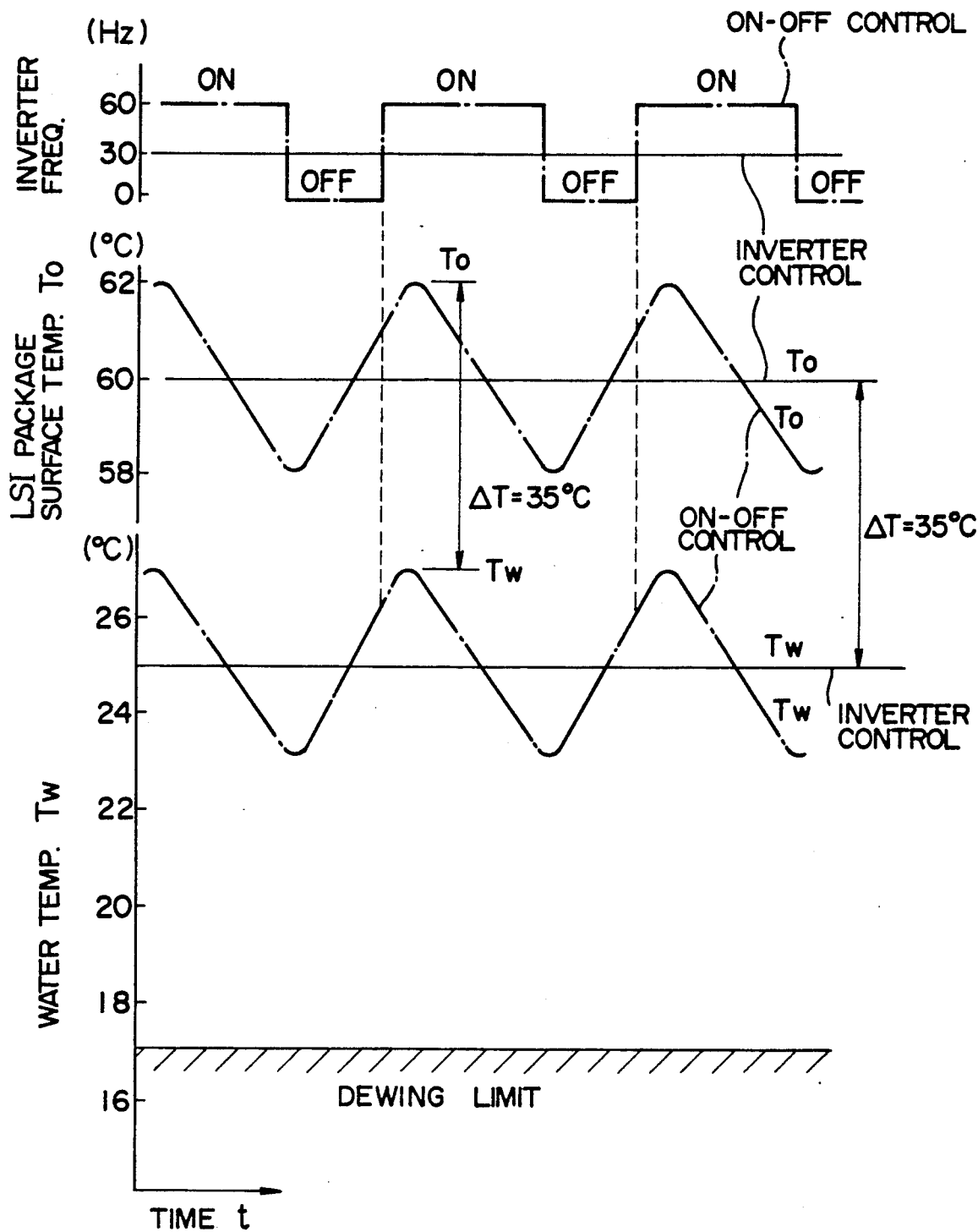
FIG. 6 graphically illustrates the variations of the LSI temperature Tw and the LSI package surface temperature To when the refrigerant compressor is controlled in ON-OFF manner according to the prior art and by an inverter, respectively.

FIG. 6 shows the temperature Tw of the LSI cooling water and the temperature To of surfaces of LSI packages as observed in the LSI temperature control system of the type shown in FIG. 1 or FIG. 5 relying upon an inverter which controls a compressor, when the system is installed in a computer room in which a large-scale computer having these LSI packages is situated. FIG. 6 also shows, for the purpose of comparison, the temperature Tw of the LSI cooling water and the temperature To of surfaces of LSI packages which are observed when the temperature control is conducted by the known control method, i.e., on-off control of the compressor.

The difference $\Delta T$ between the temperature Tw of the LSI cooling water and the temperature To of the surface of the LSI package is determined by the heat resistance provided by the heat conductor 18. It is assumed here that the temperature difference $\Delta T$ is 35° C. This temperature difference $\Delta T$ is shown by double-headed arrows in FIG. 6.

The rate of heat generation from each LSI depends on the construction of the electronic circuit but can be regarded as being materially constant. It is therefore assumed that the rate of heat generation from each LSI does not fluctuate. The temperature Tw of the LSI cooling water is detected by the temperature sensor 5. Assumption is also made here that the computing unit 11 performs a control so as to maintain the cooling water temperature Tw at 25° C.

In the operation of the embodiment shown in FIGS. 1 or 5, a refrigeration cycle is formed by the compressor 8, the heat exchanger 12 serving as a condenser, the expansion valve 14 and the heat exchanger 7 serving as an evaporator. The heat generated by the LSIs is transferred from the LSI cooling water to the refrigerant through a heat exchange conducted in the heat exchanger 7 and is then delivered to a condenser cooling water flowing through a cooling water passage 13 by a heat exchange in the heat exchanger 12. A change in the condenser cooling water temperature therefore causes a change in the cooling power of the refrigeration cycle, resulting in a change in the temperature Tw of the LSI cooling water. According to the present invention, the frequency of the driving current for driving the compressor 8 is controlled by the inverter 10 through, for example, PID control which incorporates a weight factor, so as to stably maintain the temperature Tw of the LSI cooling water thereby obtaining matching between the cooling power of the refrigeration cycle and the rate of generation of heat from LSIs. It is assumed here that the control is carried out through a frequency control of the inverter 10 as indicated by a solid line in FIG. 6 so as to maintain the temperature Tw of the LSI cooling water at the command temperature, e.g., 25° C., and that the balance between the heat generation from the LSIs and the cooling power of the refrigerant cycle is obtained when the frequency of the driving current controlled by the inverter 10 is 30 Hz. In this case, the temperature To of the surface of the LSI package, which is given by $T0 = Tw + \Delta T$, is 60° C. because the temperature difference $\Delta T$ is determined to be 35° C.

Referring now to the case of the conventional temperature control method which relies upon the on-off control of the compressor, the compressor is driven at a fixed frequency, e.g., 50 Hz or 60 Hz in case of Japan. It is only seldom that a balance is obtained between the heat generation from the LSIs and the cooling power of the refrigeration cycle with the compressor driven at such a fixed frequency. Thus, the compressor has to be repeatedly turned on and off in order to deal with the heat which is dealt with by the system of the invention when the inverter 10 drives the compressor continuously at a constant frequency of 30 Hz.

When the conventional control method is used, the LSI cooling water temperature Tw rises and falls in accordance with the turning on and off of the compressor as shown by one-dot-and-dash line in FIG. 6. It is assumed here that the LSI cooling water temperature Tw fluctuates within the range of ±2° C. as a result of the on-off control of the compressor. In such a case, the temperature Tw may rise to 27° C. when the command temperature is 25° C. This causes the temperature To of the surface of the package to rise to 62° C.

Thus, the conventional control method which employs on-off control of the compressor undesirably allows the package surface temperature To to rise to a level which is, for example, 2° C. higher than that obtained when the control is carried out by the system of the invention which relies upon the control of the compressor driving frequency by the inverter. In general, an LSI is sensitive even to a slight rise of the temperature. In order to ensure a high reliability of operation of the LSI, the operation temperature is preferably low. It will be understood that the LSI temperature control system embodying the present invention can effectively lower the maximum operation temperature of LSIs as compared with the conventional control method which utilizes on-off control of the compressor, thus contributing to higher reliability of operation of LSIs.

Another problem encountered with the LSIs of a large-scale computer installed in a computer room is that the low-temperature portions of the whole computer system tends to be wetted by dewing. This is the reason why the command temperature of the LSI cooling water is set at a relatively high temperature of 25° C. or so.

It is assumed that the lower limit temperature for preventing dewing is 17° C. In such a case, no problem is caused when the cooling is effected by the temperature control system of the present invention because the LSI cooling water temperature Tw is maintained at 25° C. constantly by virtue of the control making use of an inverter. In contrast, the conventional temperature control method relying upon the on-off control of the compressor undesirably allows the LSI cooling water temperature Tw to come down to 23° C., thus increasing the risk of dewing. It is therefore understood that the temperature control system of the present invention is superior to the conventional system even from the viewpoint of prevention of dewing.

The foregoing description is based on an assumption that the rate of generation from each LSI is constant. Actually, however, there are some cases where the rate of generation of heat from each LSI is changed.

It is assumed here that the LSI temperature control system operates at inverter frequency of 60 Hz to maintain the LSI cooling water temperature at the command temperature of 25° C., and that the rate of generation of heat from LSIs has been changed for a certain reason. If the operation is continued, the temperature of the LSI cooling water may become lower than the temperature of the air in the computer room, with the result that the moisture of air contacting the cooling water pipe is condensed, thus allowing dewing. The dewing may spread to the substrates 19 of the LSIs so as to cause a malfunctioning of the LSIs if the low temperature of the LSI cooling water is maintained. According to an embodiment of the present invention, the temperature sensor 5 in the cooling water passage 3 detects that the LSI cooling water temperature Tw has been lowered to, for example, 24.5° C. and delivers a signal to the computing unit 11 (see FIG. 1) so that the computing unit 11 operates to reduce the inverter frequency from 60 Hz to, for example, 55 Hz, whereby the cooling power of the refrigeration cycle is reduced to prevent the LSI cooling water temperature from becoming low. Conversely, when the rate of generation of heat from LSIs is increased, the inverter frequency is increased from 60 Hz so that the LSI cooling temperature is maintained at the command level, e.g., 25° C.

The cooling water to which the heat is delivered from the refrigerant through the heat exchange in the condenser discharges heat to the ambient air as it is circulated through an outdoor cooling tower (not shown). A change in the ambient air temperature causes a change in the operating condition of the refrigeration cycle, with the result that the cooling power of the refrigeration cycle and, hence, the temperature of the LSI cooling water are changed. The above-described control of the compressor driving frequency performed by the inverter is executed also in this case so as to maintain the temperature of the LSI cooling water at the command temperature.

Thus, the LSI cooling water temperature tends to deviate from the command temperature, e.g., 25° C., due to reasons such as a change in the rate of generation of heat from LSIs or a change in the temperature of the cooling water circulated through the condenser 12. However, the amount of deviation of the LSI cooling water temperature experienced in the temperature control system is much smaller than that caused in the conventional temperature control system which relies upon repeated start and stop of the compressor. Thus, the LSI temperature control system of the present invention, which employs a control of the compressor driving frequency by an inverter, offers a higher reliability of the LSIs over the known systems.

Figure 7:
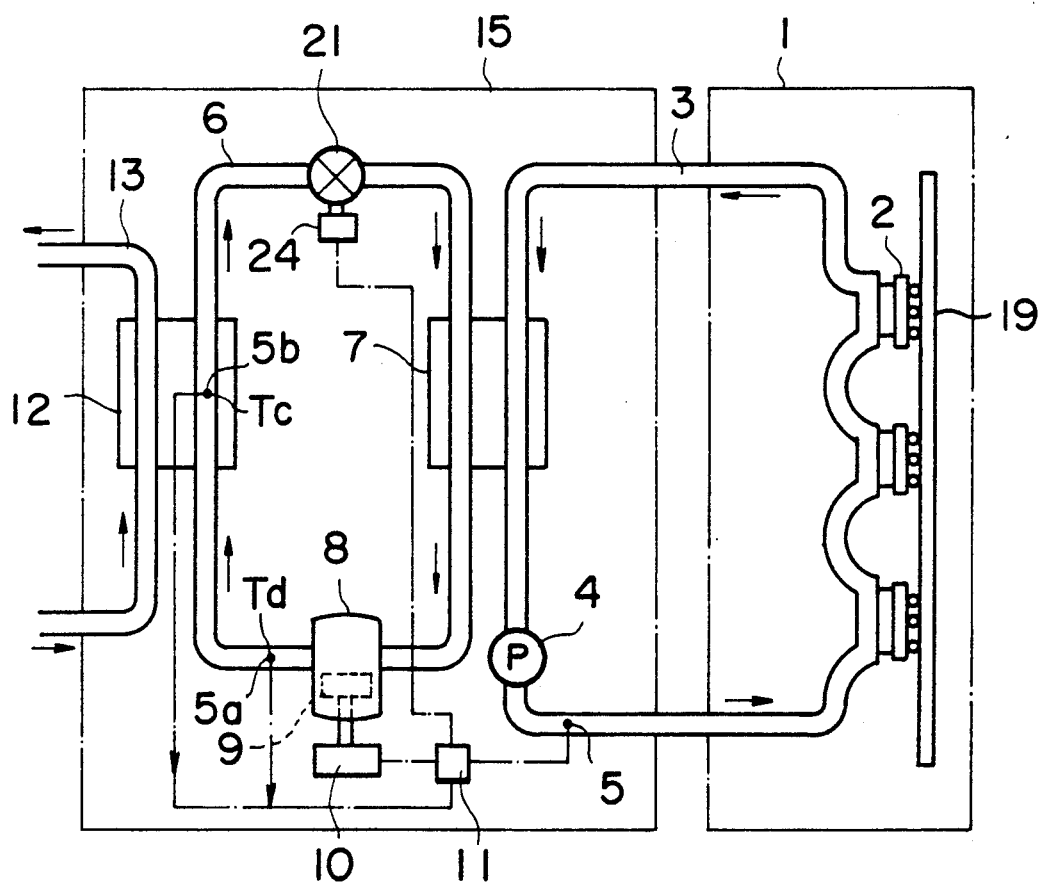
FIG. 7 is similar to FIGS. 1 and 5 but illustrates a further embodiment of the present invention.

FIG. 7 shows a different embodiment of the LSI temperature control system of the present invention. In this embodiment, the computing unit 11, capable of controlling the frequency of operation of the inverter 10 for controlling the compressor, is additionally provided with an electronic circuit which is capable of electrically controlling the opening degree of an electrical expansion valve 21 upon receipt of a signal from a second temperature sensor 5a indicative of the temperature of refrigerant discharged from the compressor and a signal from a third temperature sensor 5b indicative of the condensation temperature Tc of the refrigerant in the condenser 12. The electrical expansion valve 21 has an actuator 24 incorporating a motor which operates in accordance with an instruction signal from the computing unit 11 so as to change the degree of opening of the valve thereby controlling the state of the refrigeration cycle.

The embodiment shown in FIG. 7 employs, as in the cases of the preceding embodiments, the control of the compressor driving frequency by the inverter 10 so as to maintain the LSI cooling water temperature at the command level in accordance with the signal from the temperature sensor 5 indicative of the actual LSI cooling water temperature. In addition to this control of the compressor driving frequency, the embodiment of FIG. 7 employs the control of the opening degree of the electrical expansion valve 21 which is executed in accordance with the difference between the refrigerant discharge temperature Td at the compressor outlet and the refrigerant condensation temperature Tc in the condenser 12, thereby to maximize the efficiency of the refrigeration cycle. As a matter of fact, the compressor 8 is operable only within a predetermined range of pressure, and the control of the compressor by the inverter may cause the compressor to operate at a pressure which does not fall within this range of pressure. In such a case, the electrical expansion valve 21 is controlled to vary the condition of the refrigeration cycle so as to enable the compressor to operate within the above-mentioned predetermined range.

Figure 8:
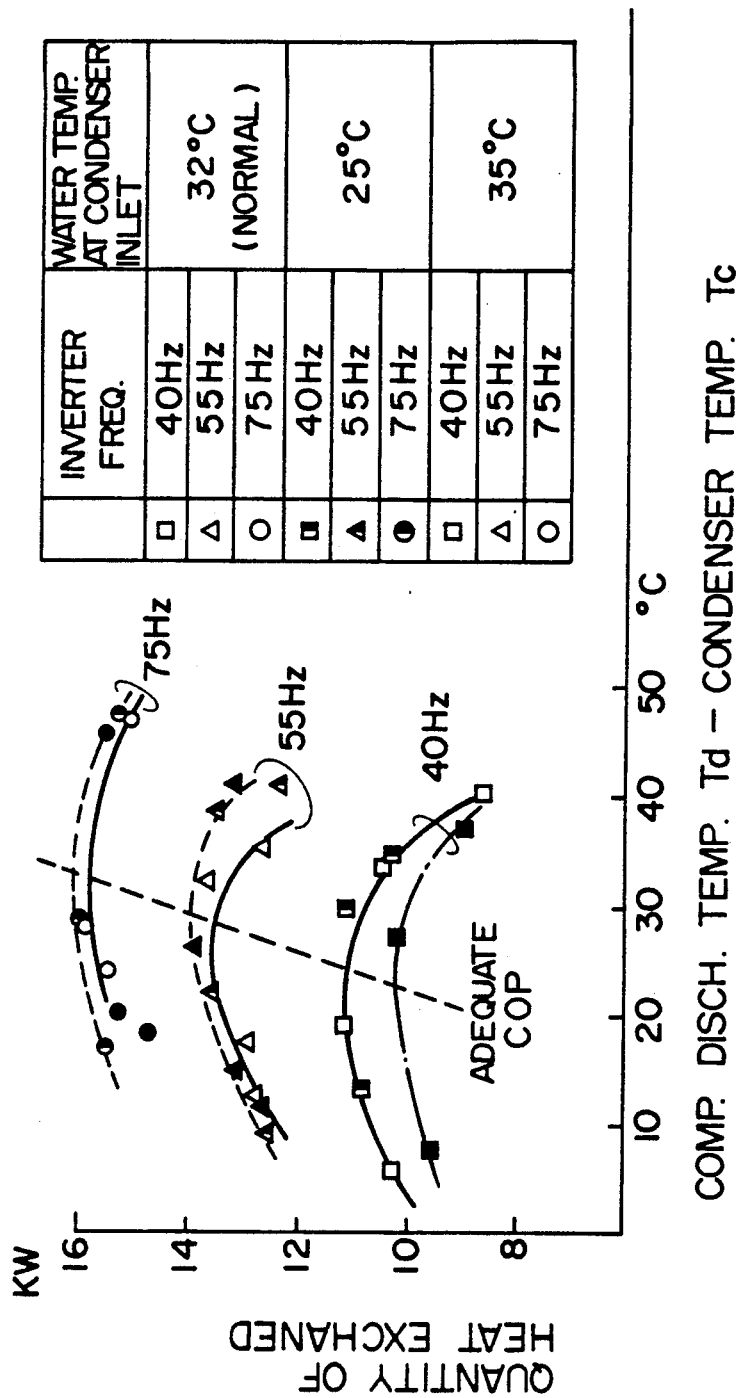
FIG. 8 graphically illustrates the results of tests conducted with different inverter frequencies and in respect of the amounts of exchanged heat relative to the difference between the compressor discharge temperature and the condensing temperature.

FIG. 8 shows experimentally obtained relationship between the rate of heat exchange in the evaporator of a refrigeration cycle, i.e., the cooling power of the refrigeration cycle which is indicated by axis of ordinate, and the difference between the refrigerant discharge temperature Td at the compressor outlet and the condensation temperature Tc of the refrigerant which is indicated at the axis of abscissa, at various compressor driving frequency values. As will be seen from FIG. 8, the condition of the refrigeration cycle for optimizing the efficiency (COP) of the refrigeration cycle through the control of the electrical expansion valve can be determined by the compressor driving frequency provided by the inverter and the difference between the compressor discharge temperature and the condensation temperature of the refrigerant.

Namely, in the embodiment shown in FIG. 7, the value of the difference between the compressor discharge temperature Tc and the condensation temperature Td, represented by the axis of abscissa in FIG. 8, is varied by changing the degree of opening of the electrical expansion valve. Namely, instructions are given from the computing unit 11 to the compressor 8 and the expansion valve 21 such that the difference between the compressor discharge temperature Tc and the condensation temperature Td coincides with the command temperature which is beforehand determined for each value of the compressor driving frequency given by the inverter. The compressor discharge temperature Td and the condensation temperature Tc of the refrigerant are detected by the aforementioned temperature sensors 5a and 5b. It is thus possible to operate the refrigeration cycle in such a manner as to maximize the efficiency at each value of the compressor driving frequency which is controlled by the inverter in accordance with a change in the operating condition such as the rate of generation of heat from the LSIs.

The experimental data shown in FIG. 8 are independent from any change in the external cooling water, i.e., the cooling water circulated through the condenser of the refrigeration cycle. Therefore, detection of the temperature of the external cooling water is unnecessary, thus simplifying the control performed by the computing unit 11.

Figure 9:
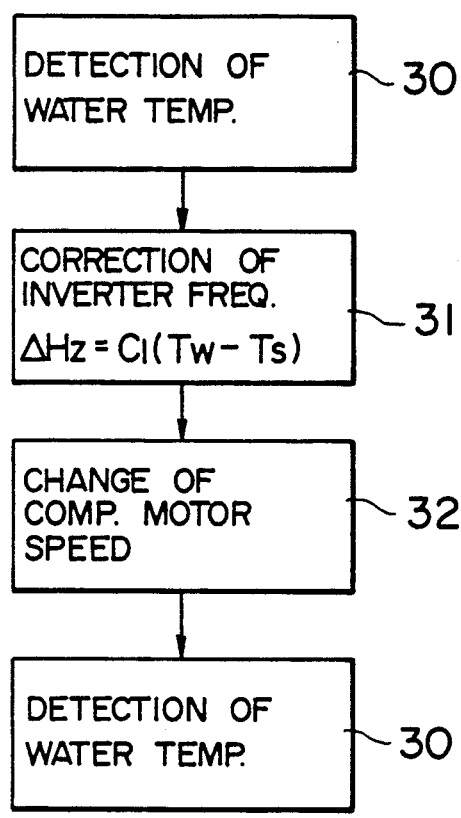
FIG. 9 shows the chart of the operation of the inverter-controlled LSI temperature controlling system.
Figure 10:
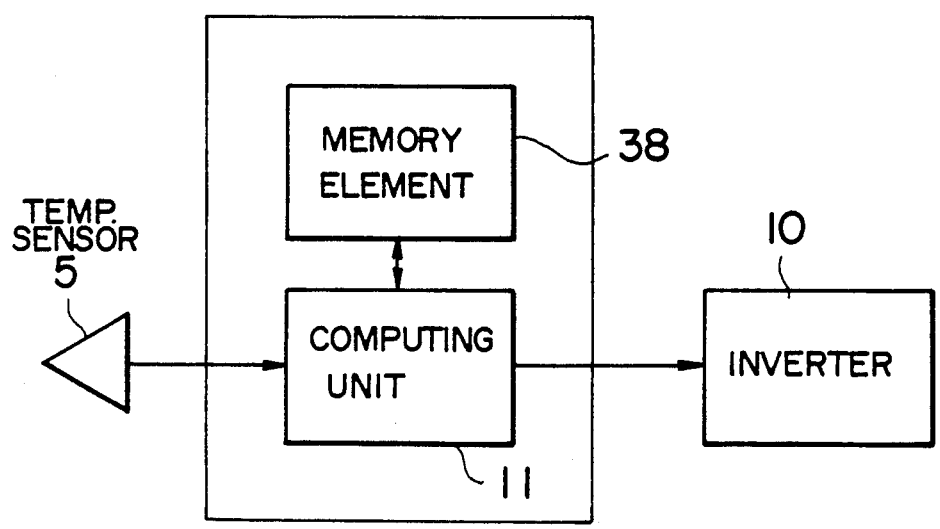
FIG. 10 is a block diagram of the component parts of the system operative to carry out the control shown by the chart in FIG. 9.

FIG. 9 illustrates the flow of the control performed by the LSI temperature control system of the present invention which relies upon the the compressor driving frequency control conducted by an inverter, while FIG. 10 is a block diagram of the system for performing the control shown in FIG. 9.

Referring to FIG. 9, the temperature Tw of the LSI cooling water temperature is detected by a temperature sensor 5 in Step 30 and, in Step 31, a correction of the compressor driving frequency is executed using an inverter frequency correction amount $\Delta Hz$ which is determined in accordance with the following formula (1).

$$\Delta Hz = C_1(Tw - Ts) \qquad (1)$$

where, Tw represents the temperature of the LSI cooling water, Ts represents a set value, i.e., the command, of the LSI cooling water temperature, e.g., 25° C., and $C_1$ represents a control constant. As will be seen from FIG. 10, the command temperature Ts and the control constant $C_1$ are stored in a memory 38 and the computation of the formula (1) and the correction of the frequency are performed by the computing unit 11. In Step 32, the speed of the compressor motor is changed by the inverter with the result that the rate of cooling effected by the cooling water is changed. The process then returns to Step 30 in which the temperature Tw of the cooling water is detected again.

Figure 11:
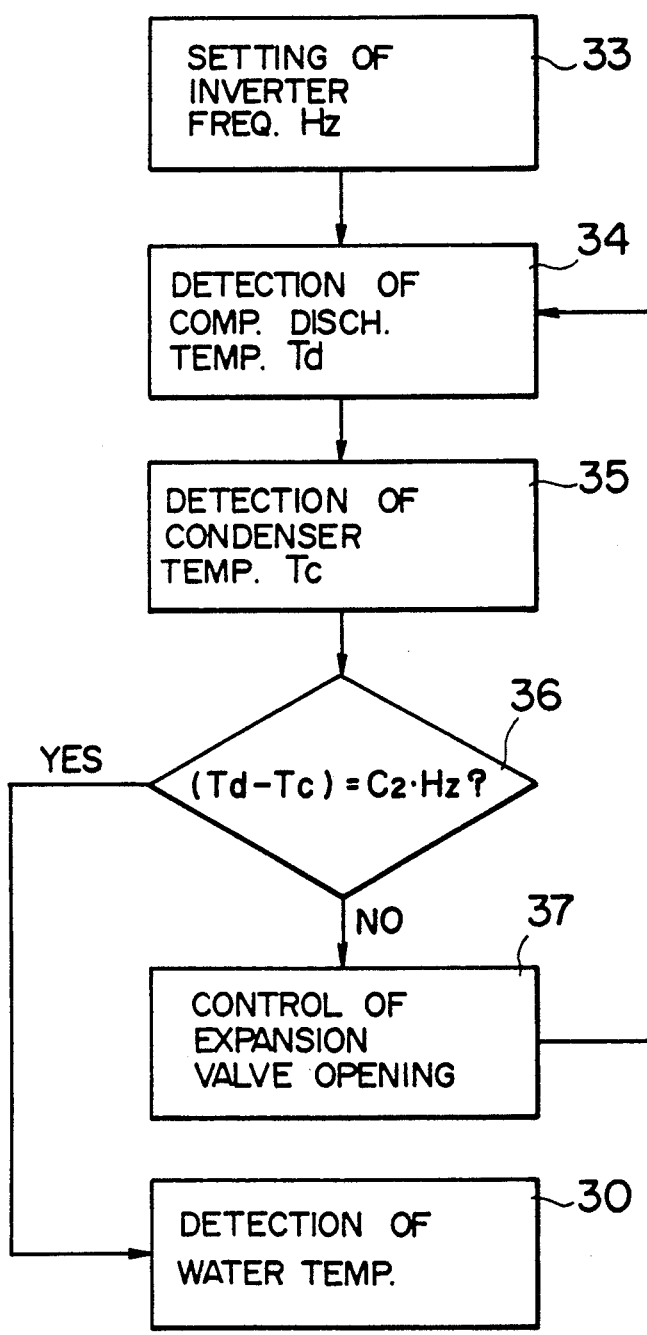
FIG. 11 shows the chart of the operation of the inverter-controlled LSI temperature controlling system in which the refrigeration circuit includes an electrically operated expansion valve in addition to the inverter-controlled compressor.

FIG. 11 is a flow chart of the control of the refrigeration cycle conducted through the control of the electrical expansion valve 21 in response to the change in the compressor driving frequency which is controlled by the inverter, while FIG. 12 is a block diagram of the unit for realizing such a control.

Referring to FIG. 11, the opening degree of the electrical expansion valve 21 is controlled under a condition where the compressor driving frequency Hz has been set by the inverter in Step 33. The compressor discharge temperature Td and the condensation temperature Tc of the refrigerant are detected in Steps 34 and 35, respectively, by the sensors 5a and 5b. Then, the left and right sides of the following formula (2) are computed in Step 36.

$$Td - Tc = C_2 \cdot Hz \qquad (2)$$

where, $C_2$ is a constant which is determined beforehand so as to correspond to the maximum efficiency point shown by the curve COP in FIG. 8. If the value of $(Td - Tc)$ on the left side and the value of $C_2 \cdot Hz$ on the right side of the formula (2) are equal, the process proceeds to Step 30 in which the LSI cooling water temperature Tw is detected by the water sensor 5. However, if the values of the left and right sides of the formula (2) are not equal, the process proceeds to Step 37 in which the degree of opening of the electrical expansion valve 1 is changed and then the Steps 34 and 35 are executed again to detect the compressor discharge temperature Td and the condensation temperature Tc of the refrigerant. Then, the abovedescribed operation is repeated cyclically.

The computation executed in Step 36, as well as the control of the electrical expansion valve 21 performed in Step 37, are performed by the computing unit 11 shown in FIG. 12. The set value $C_2$ is beforehand stored in the memory element 38. The computing unit 11 of FIG. 12 gives an instruction to the expansion valve actuator 24 thereby to vary the opening degree of the electrical expansion valve 21.

Figure 13:
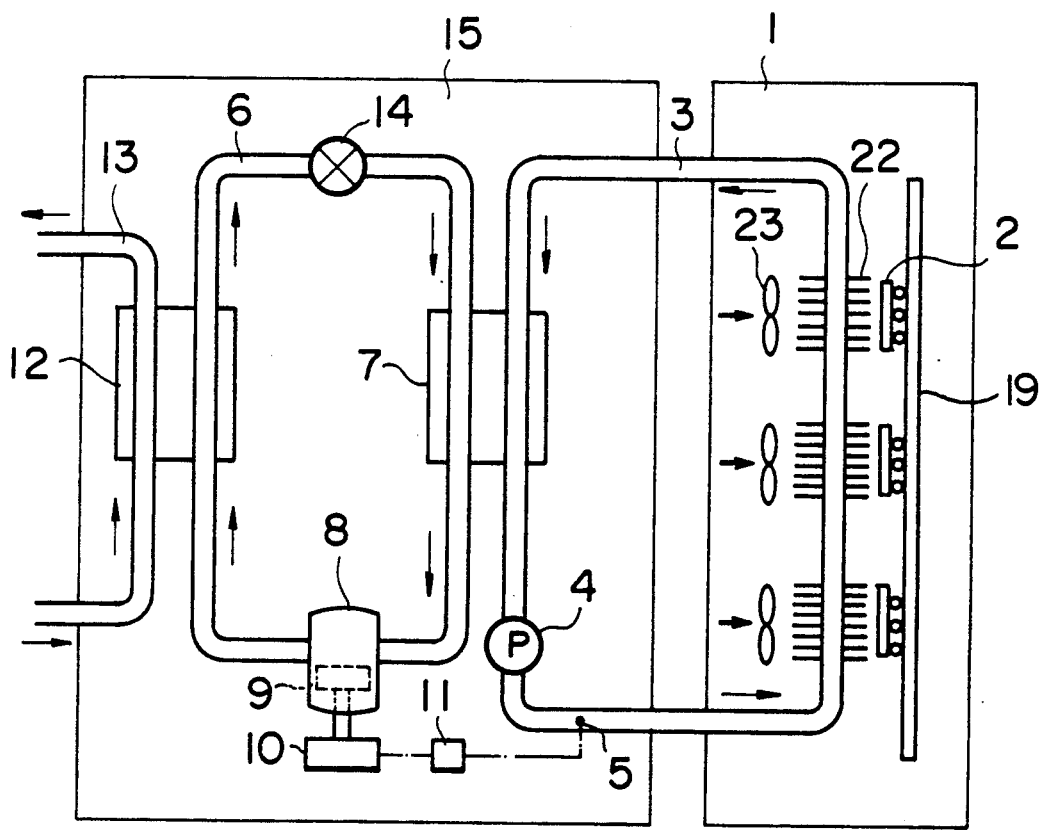
FIG. 13 is similar to FIGS. 1, 5 and 7 but illustrates a still further embodiment of the invention.

FIG. 13 shows a different embodiment of the present invention in which a heat exchange between cooling water flowing through the cooling water passage 3 and cooling air forced to flow by a blower 23 is conducted in a heat exchangers 22 so that the LSIs 2 are cooled by chilled air.

Figure 14:
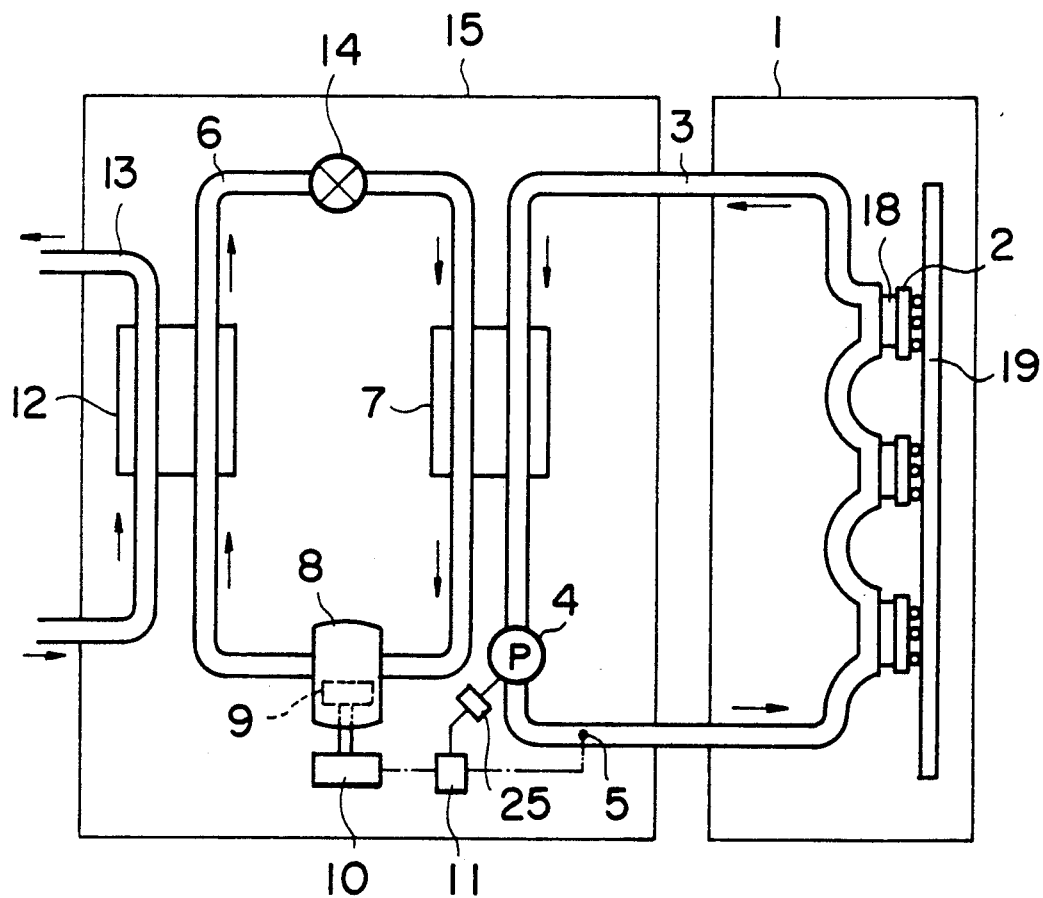
FIG. 14 is similar to FIG. 13 but illustrates a still further embodiment of the invention.

FIG. 14 shows a different embodiment in which an inverter 25 is provided for the purpose of controlling the operation speed of the water circulating pump 4 for circulating the LSI cooling water, in addition to the inverter 10 which controls the compressor. This arrangement is effective particularly in the case where the suction pressure of the compressor is increased. In general, a refrigerant compressor is often driven with a high suction pressure in order to achieve a high efficiency. Unfortunately, however, there is a practical upper limit in the suction pressure of the compressor and, therefore, the control has to be done to lower the compressor suction pressure when the suction pressure has been increased beyond this upper limit of the suction pressure. Such a control can be effected by reducing the rate of heat transfer in the heat exchanger 7 serving as the evaporator. In the embodiment of FIG. 14, the computing unit 11 delivers an instruction to lower the driving frequency determined by the inverter 25 so as to reduce the speed of the water circulating pump 4. Consequently, the velocity of the cooling water flowing in the cooling water passage 3 is lowered to reduce the rate of transfer of heat in the heat exchanger 7 so that the pressure of the evaporated refrigerant and, therefore, the suction pressure of the compressor are lowered.

Figure 15:
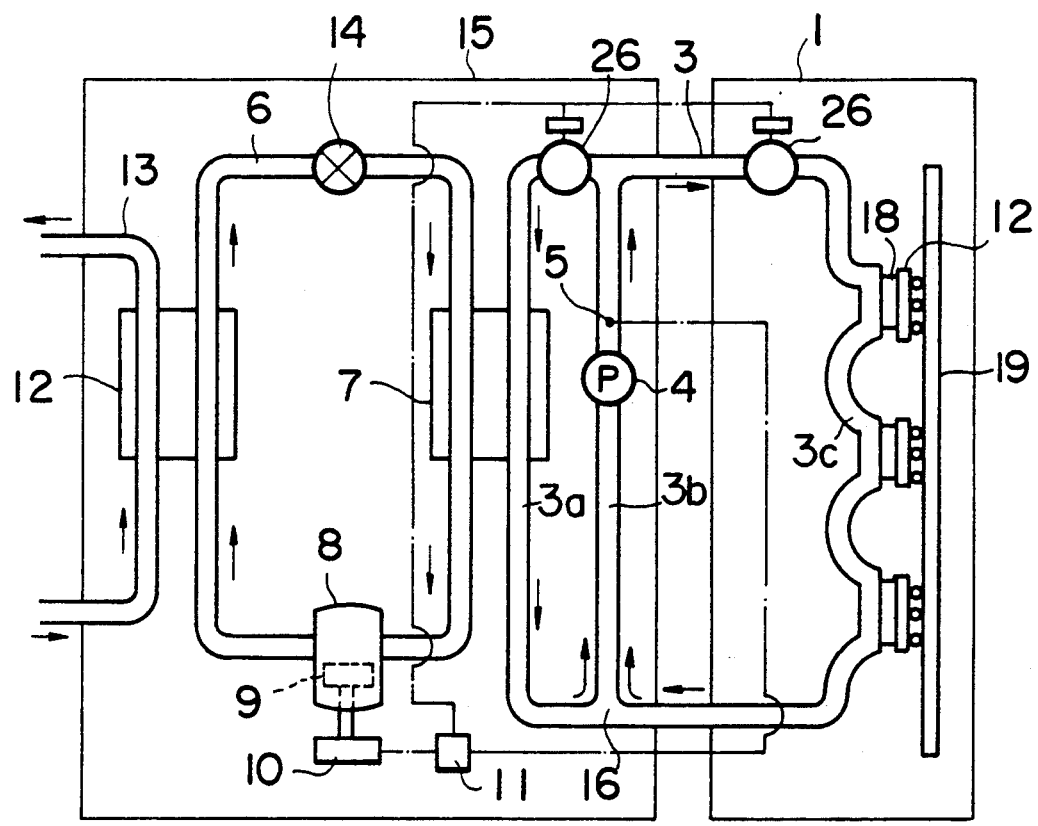
FIG. 15 is similar to FIG. 14 but illustrates a still further embodiment of the invention.

FIG. 15 shows a different embodiment which is similar to the embodiment shown in FIG. 5. In this embodiment, however, a pair of flow rate control valves 26 are provided in the passage 3 of the LSI cooling water. The degrees of opening of these valves 26 are controlled electrically by the computing unit 11. This, however, is not exclusive and a suitable means may be provided for allowing manual control of opening degrees of these valves 26 instead of or in addition to the electrical control performed by the computing unit 11. These valves 26 are intended for reducing the velocity of the cooling water flowing through through the evaporator 7 when the refrigerant gas pressure at the suction side of the compressor has become excessively high. This control can be effected without causing any change in the velocity of the cooling water flowing in contact with the LSIs 2, by virtue of provision of the pair of valves 26.

More specifically, in the embodiment shown in FIG. 15, the LSI cooling water passage 3 is so constructed that the water which has cooled the LSIs 2 and the water which has been cooled through the heat exchanger 7, i.e., evaporator, merge with each other at a junction 16 on the downstream side of which is disposed the water circulating pump 4. According to this arrangement, it is possible to maintain the temperature of the LSI cooling water at the LSI inlet substantially at the same level as the cooling water temperature at the inlet of the heat exchanger 7, i.e., evaporator, so that the cooling water temperature at the inlet of LSIs can be set to a lower level as compared with the arrangement shown in FIG. 7. The cooling passage system shown in FIG. 15 offers the following advantage depending on the set temperature of the LSI cooling water temperature. For instance, assuming that the command temperature of the LSI cooling water is 25° C. in the arrangement shown in FIG. 7, the the temperature of the cooling water entering the list exchanger 7, i.e. evaporator has been heated in amount determined by the heat generation from the LSIs 2 and the quantity of the cooling water flowing through the LSIs, e.g., up to 35° C., with the result that the suction pressure of the compressor is increased excessively. The arrangement shown in FIG. 15 is free from such a problem because the temperature of the cooling water at the inlet of the evaporator is substantially the same as the command temperature, e.g., 25° C., of the LSI cooling water. This advantageously allows a wider selection of the compressor.

In the arrangement shown in FIG. 15, water of a low temperature, e.g., 20° C., coming from the heat exchanger 7 and the water of a comparatively high temperature, e.g., 35° C., computing from the LSIs 2 merge in each other at the junction 16. In order to ensure an efficient mixing of water of two streams of different temperatures, the conventional system relying upon an on-off control of the compressor requires a water tank. Such a water tank, however, can be dispensed with in the described embodiment of the invention because delicate control of the water temperature is possible by virtue of the control of the compressor driving frequency performed by the inverter. It will also be seen that the water circulation pump 4 promotes the mixing of the water from the LSIs 2 and the water from the list exchanger 7, i.e. evaporator.

Figure 16:
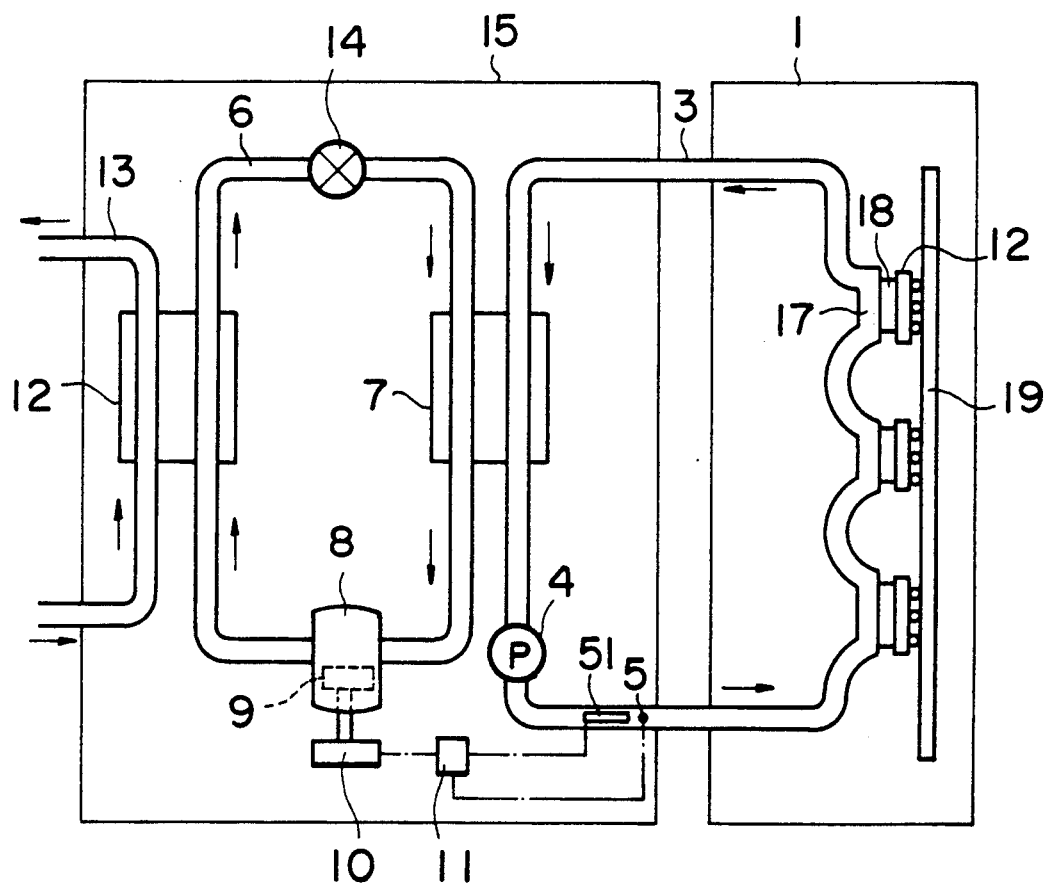
FIG. 16 is similar to FIG. 15 but illustrates a still further embodiment of the invention.

FIG. 16 shows a different embodiment which is effective in preventing dewing on the LSIs at the start-up of the LSIs. The arrangement of this embodiment is substantially the same as that shown in FIG. 7, through the line for transmitting the control signal to the expansion valve 14 is omitted. More specifically, this embodiment is characterized by the use of a heater 51 disposed in the passage 3 of the LSI cooling water. In this embodiment, the heater 51 is energized in advance of the starting of the LSIs so as to enable the LSI cooling water temperature to rise to the command temperature in a short period of time. The rise of the LSI cooling water temperature, however, continues even after termination of the supply of energy to the heater, due to the heat capacity of the LSI cooling water and that of the heater itself, so that the LSI cooling water temperature may undesirably rise beyond the command temperature. To obviate such a problem, in this embodiment of the present invention, the energy input to the heater 51 is progressively decreased when the LSI cooling water temperature has approached the command temperature and the compressor 8 of the refrigeration cycle is started to enable the LSI cooling water temperature to be settled at the command level in a short time. Once the LSIs are started, the refrigeration cycle including the compressor 8 effectively cools the LSIs 2.

Figure 17:
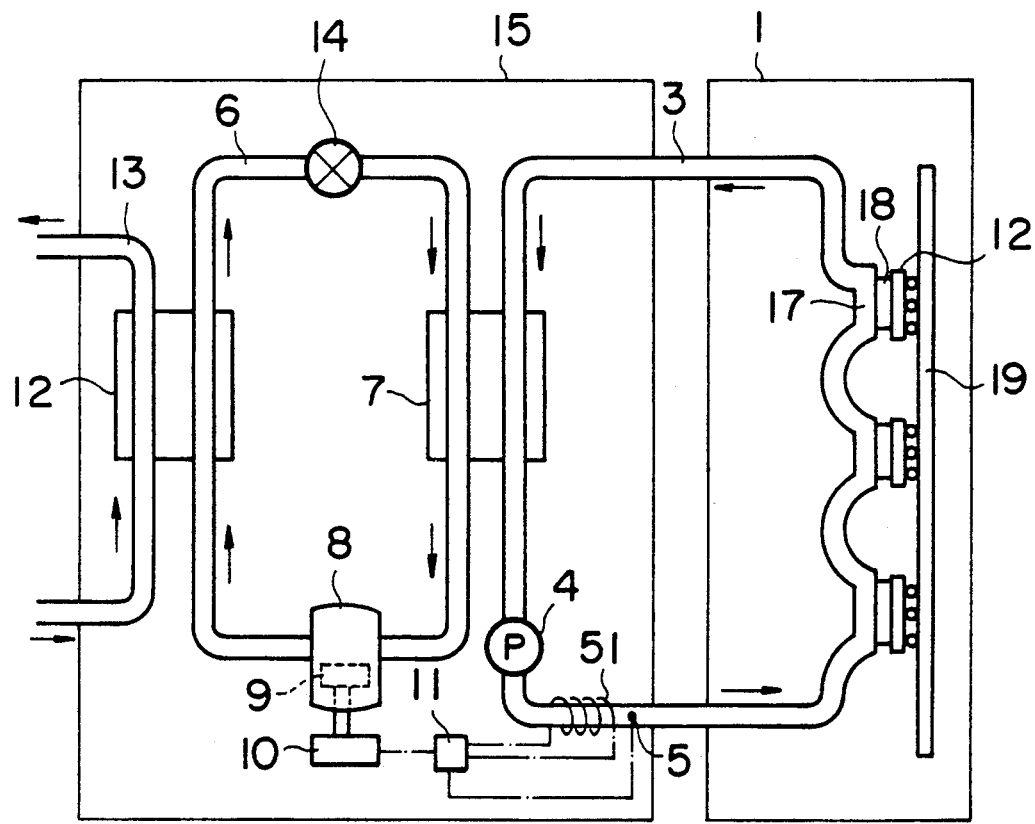
FIG. 17 is similar to FIG. 16 but illustrates a still further embodiment of the invention.
Figure 18:
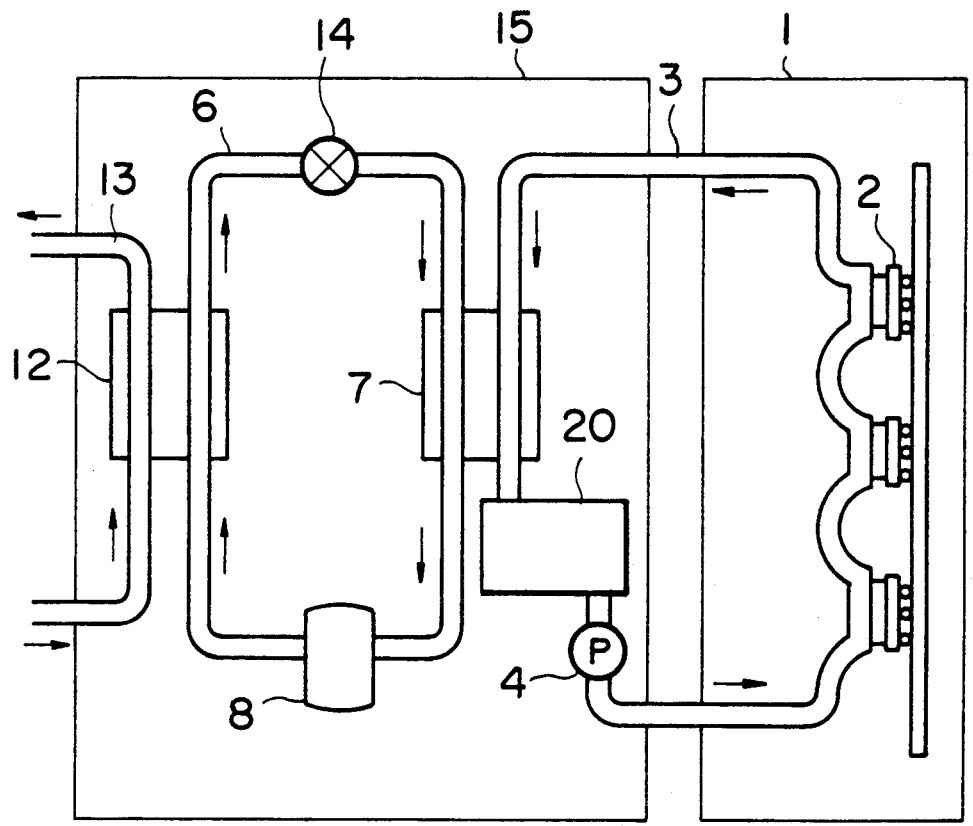
FIG. 18 shows the prior art discussed in the introductory portion of the specification.

FIG. 17 illustrates a different embodiment of the invention in which the LSI cooling water is heated by a heater 51 in the form of a coil wound around the LSI cooling water pipe, unlike the embodiment of FIG. 16 in which the heater 51 is disposed in the LSI cooling water pipe.

As will be understood from the foregoing description, the LSI temperature control system of the present invention is capable of performing a delicate and fine control of LSIs without requiring the size to be increased. The temperature control system of the present invention, therefore, can suitably be used in cooling a large-scale computer in which the removal of heat generated by a number of LSIs is a critical problem.

What is claimed is:

1. An LSI temperature controlling system comprising:
   a closed fluid circuit through which a first fluid for controlling the temperature of an LSI is circulated;
   a refrigeration circuit through which refrigerant is circulated, said refrigeration circuit including a refrigerant compressor, a first heat exchanger for exchanging the heat of said first fluid and said refrigerant, means for expanding the refrigerant compressed by said compressor and a second heat exchanger for exchanging the heat of said refrigerant and a second fluid;
   an electric motor for driving said refrigerant compressor;
   an inverter for controlling the speed of said motor;
   a temperature sensor for detecting the temperature of said first fluid to generate a temperature signal;
   an electric control circuit responsive to said temperature signal to control the operation of said inverter,
   wherein said first fluid comprises water for cooling the LSI, and
   wherein said closed fluid circuit includes a first passage at least a part of which extends through said first heat exchanger, a second passage connected to and extending fluidly in series to said first passage, a third passage at least a part of which is disposed adjacent to the LSI, said third passage extending fluidly in parallel to said first passage and connected fluidly in series to said second passage, and a water pump for circulating the LSI cooling water through said closed fluid circuit such that the water discharged from said pump is divided into first and second portions, said first portion of the water flowing through said first passage in a heat exchanging relationship with the refrigerant flowing through said first heat exchanger, said second portion of water flowing through said third passage in a heat exchanging relationship with said LSI, said first and second portions of the water being collected in and flowing through said second passage whereby said first and second portions of the water cooperate to exchange heat from said LSI and said refrigerant.

2. An LSI temperature controlling system according to claim 1, wherein said refrigerant expanding means comprises an expansion valve having a variable valve opening and means for operating said expansion valve to vary said valve opening, and wherein said electric control circuit is operative to actuate said valve operating means based on said temperature signal.

3. An LSI temperature controlling system according to claim 1, wherein said refrigeration circuit further includes means for changing over the direction of the flow of the refrigerant through said refrigeration circuit.

4. An LSI temperature controlling system according to claim 1, wherein said temperature sensor is disposed to detect the temperature of the LSI cooling water at a point downstream of said pump and upstream of said LSI.

5. An LSI temperature controlling system according to claim 1, wherein said second heat exchanger is so constructed as to cause the refrigerant to flow therethrough in heat exchange relationship to air surrounding said second heat exchanger.

6. An LSI temperature controlling system according to claim 1, wherein first and second valve means are operative to control the rates of the flows of the first and second portions of the water through said first and third passages.

7. An LSI temperature controlling system according to claim 6, wherein said first and second valve means each have a variable restriction opening and wherein said electric control circuit is operative to control the degrees of the restriction openings of said first and second valve means based on said temperature signal.

8. An LSI temperature controlling system comprising:
   a closed fluid circuit through which water for cooling an LSI is circulated;
   a refrigeration system including a refrigerant compressor, an electric motor for driving said compressor, a first heat exchanger for exchanging the heat of the LSI cooling water and the refrigerant, an expansion valve having a variable valve opening, a second heat exchanger for exchanging the heat of the refrigerant and another fluid, and a four-way valve for changing over the direction of the flow of refrigerant;
   an inverter for controlling the speed of said electric motor;
   means for operating said expansion valve to vary said valve opening;
   a temperature sensor for detecting the temperature of the LSI cooling water to generate temperature signals;
   an electric control circuit responsive to said temperature signal to operate said inverter and actuate said expansion valve operating means,
   wherein said closed fluid circuit includes a first passage at least a part of which extends through said first heat exchanger, a second passage connected to and extending fluidly in series to said first passage, a third passage at least a part of which is disposed adjacent to the LSI, said third passage connected fluidly in series to said second passage and extending fluidly in parallel to said first passage, and a water pump disposed in said second passage to circulate the LSI cooling water through said closed fluid circuit such that the water discharged from said water pump first flows through said second passage downstream of said pump and is then divided into first and second portions, said first portion of the water flowing through said first passage in a heat exchanging relationship to the refrigerant flowing through said first heat exchanger, said second portion of water flowing through said third passage in a heat exchanging relationship with said LSI, said first and second portions of the water being then collected in and flowing through said second passage whereby said first and second portions of the water cooperate to exchange heat from the LSI and said refrigerant.

9. An LSI temperature controlling system according to claim 8, wherein said temperature sensor is disposed in said second passage to detect the temperature of the LSI cooling water.

10. A method of operating an LSI temperature controlling system that includes a closed fluid circuit through which water for cooling an LSI is circulated;
a refrigeration system including a refrigerant compressor, an electric motor for driving said compressor, a first heat exchanger for exchanging the heat of the LSI cooling water and the refrigerant, an expansion valve, a second heat exchanger for exchanging the heat of the refrigerant and another fluid; and an inverter for controlling the speed of said electric motor, said closed fluid circuit including a first passage at least a part of which extends through said first heat exchanger, a second passage connected to and extending fluidly in series to said first passage, a third passage at least a part of which is disposed adjacent to the LSI, said third passage connected fluidly in series to said second passage and extending fluidly in parallel to said first passage, and a water pump disposed in said second passage, said method comprising the steps of:

operating said water pump to circulate the LSI cooling water through said closed fluid circuit such that the water discharged from said pump first flows through said second passage downstream of said pump and is then divided into first and second portions;

causing said first position of the water to flow through said first passage in heat exchanging relationship to the refrigerant flowing through said first heat exchanger;

causing said second portion of the water to flow through said third passage in heat exchanging relationship to said LSI;

thereafter collecting said first and second portions of the water in said second passage upstream of said water pump and causing the thus collected water portions to flow therethrough into said water pump whereby said first and second portions of water cooperate to exchange heat from said LSI and said refrigerant;

detecting the temperature of the LSI cooling water; and controlling a frequency of said inverter based on a difference between the thus detected temperature of the LSI cooling water and a preset reference temperature.

* * * * *